(12) United States Patent
Kato et al.

(10) Patent No.: US 7,429,704 B2
(45) Date of Patent: Sep. 30, 2008

(54) ELECTRONIC COMPONENT, ELECTRO-OPTICAL DEVICE, AND ELECTRONIC APPARATUS

(75) Inventors: Hiroki Kato, Suwa (JP); Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/332,878

(22) Filed: Jan. 13, 2006

(65) Prior Publication Data

US 2006/0157870 A1     Jul. 20, 2006

(30) Foreign Application Priority Data

Jan. 14, 2005    (JP)    ................................ 2005-007149

(51) Int. Cl.
*H01L 23/48*      (2006.01)
(52) U.S. Cl. .................. 174/534; 257/780; 257/738
(58) Field of Classification Search ................ 174/534; 257/741, 773, 780, 737, 738
See application file for complete search history.

(56) References Cited

U.S. PATENT DOCUMENTS

| | | | |
|---|---|---|---|
| 5,877,556 A | | 3/1999 | Jeng et al. |
| 6,433,438 B2 * | | 8/2002 | Koubuchi et al. ........... 257/776 |
| 6,555,908 B1 * | | 4/2003 | Eichelberger et al. ....... 257/737 |
| 6,853,080 B2 * | | 2/2005 | Hashimoto .................. 257/773 |
| 6,919,634 B2 * | | 7/2005 | Kuramoto et al. ........... 257/780 |
| 6,940,175 B2 * | | 9/2005 | Iwazaki et al. .............. 257/780 |
| 7,023,088 B2 * | | 4/2006 | Suzuki et al. ................ 257/734 |
| 7,098,518 B1 * | | 8/2006 | Mostafazadeh et al. ..... 257/780 |
| 2001/0045636 A1 * | | 11/2001 | Yamaguchi .................. 257/686 |
| 2003/0092326 A1 | | 5/2003 | Nishikawa et al. |
| 2004/0245612 A1 | | 12/2004 | Hashimoto |
| 2005/0006789 A1 * | | 1/2005 | Tomono et al. ............. 257/778 |
| 2006/0060983 A1 * | | 3/2006 | Saito ........................... 257/780 |

FOREIGN PATENT DOCUMENTS

| | | |
|---|---|---|
| EP | 1 427 007 A2 | 6/2004 |
| JP | 10-335333 | 12/1998 |
| JP | 2001-110831 | 4/2001 |
| JP | 2001-358165 | 12/2001 |
| JP | 2002-134559 | 5/2002 |
| JP | 2004-186333 | 7/2004 |
| KR | 1998-80683 | 11/1998 |

\* cited by examiner

*Primary Examiner*—Hung V Ngo
(74) *Attorney, Agent, or Firm*—Harness, Dickey & Pierce, P.L.C.

(57) ABSTRACT

Provided is an electronic component including a pad provided on an active surface of a rectangular chip substrate, a resin protrusion provided along sides of the chip substrate, and a conductive portion which is electrically connected to the pad and which is formed out of a conductive film covering the surface of the resin protrusion. The resin protrusion includes a protruded body extending linearly and a plurality of the resin protrusions are provided on at least one side of the chip substrate to form a clearance in an intermediate portion of the side.

7 Claims, 5 Drawing Sheets

ELECTRONIC COMPONENT, ELECTRO-OPTICAL DEVICE, AND ELECTRONIC APPARATUS

BACKGROUND

1. Technical Field

The present invention relates to an electronic component, an electro-optical device, and an electronic apparatus.

2. Related Art

In circuit boards or liquid crystal display devices fitted to a variety of electronic apparatuses, the technique of mounting electronic components such as semiconductor ICS thereon has been used. For example, a liquid crystal driving IC chip (electronic component) for driving a liquid crystal panel is mounted on a liquid crystal display device. The IC chip may be mounted directly on a glass substrate constituting the liquid crystal panel and may be mounted on a flexible printed circuit (FPC) substrate which is fitted to the liquid crystal panel. In recent years, decrease in size or decrease in pitch of the IC chip fitted to the electronic apparatus has been required with decrease in size of the electronic apparatuses.

For example, by providing resin protrusions coated with a conductive film connected to an electrode on an active surface of an IC chip on which semiconductor devices are formed, it is possible to accomplish enhancement in reliability of the IC chip with thermal stress alleviated through pressure junction using the elastic force of resin. Here, there is known a technique for accomplishing decrease in pitch of the resin protrusions by removing a part of the resin protrusions by the use of plasma process (for example, JP-A-2004-186333).

However, when the resin protrusions are formed by the use of the plasma process, wire portions formed on the IC chip are charged up due to an antenna ratio in plasma, thereby varying characteristics of transistors. Such variation in characteristics of transistors may cause failure of the IC chip and decrease in yield.

Accordingly, a resin protrusion extending linearly is provided along respective sides of an active surface of a chip substrate constituting the IC chip and a plurality of conductive portions formed out of a conductive film connected to the pads of the IC chip are provided on the surface of the resin protrusion. In this way, it is considered that the decrease in pitch can be accomplished by the plurality of conductive portions without carrying out the plasma process for forming clearances in the resin protrusion. The resin protrusion has clearances only at the ends which are four corners of the IC chip.

When such an IC chip having the resin protrusion extending linearly is mounted on a substrate, a resin having a thickness greater than that of the resin protrusion is first provided on a mounting surface of the substrate and then the IC chip is mounted on the substrate while pressing and heating the IC chip on the substrate. Then, the resin protrusion disposed on the IC chip pushes out the resin. Accordingly, the pushed-out resin is externally discharged from the IC chip through the clearances in the resin protrusion.

In this way, the resin protrusion is electrically connected to electrodes of the substrate in the state that the IC chip is pressed on the substrate and thus the resin protrusion is crushed on the substrate. In this state, by curing the resin, the IC chip is mounted on the substrate.

However, the intermediate portions of the sides of the chip substrate without the clearances between the resin protrusions cannot smoothly discharge the resin, unlike the end portions of the chip substrate in which the clearances are disposed between the resin protrusions. That is, a larger amount of resin is discharged from the end portions of the chip substrate in which the clearances are disposed between the resin protrusions than from the intermediate portions of the sides of the chip substrate. In this way, since the resin protrusions disposed along the sides of the chip substrate have different amounts of resin discharged through the intermediate portions and the end portions, the resin protrusions cannot be provided uniformly. Accordingly, since the electrical connection property varies depending upon positions of the IC chip when the IC chip is mounted on the substrate, it is difficult to obtain reliability of the IC chip.

SUMMARY

An advantage of the present invention is to provide an electronic component, an electro-optical device, and an electronic apparatus, which have an excellent discharge ability of resin and an enhanced reliability without requiring a plasma process.

According to an aspect of the present invention, there is provided an electronic component including a pad provided on an active surface of a rectangular chip substrate, a resin protrusion provided along sides of the chip substrate, and a conductive portion which is electrically connected to the pad and which is formed out of a conductive film covering the surface of the resin protrusion, wherein the resin protrusion includes a protruded body extending linearly and a plurality of the resin protrusions are provided on at least one side of the chip substrate to form a clearance in an intermediate portion of the side.

In the electronic component according to the present invention, for example, when the electronic component is mounted on a substrate with resin, having a thickness greater than the thickness of the resin protrusion interposed therebetween, connection terminals of the substrate are electrically connected to the conductive portions disposed on the surface of the resin protrusion by allowing the resin protrusion to push out and crush the resin. At this time, since a plurality of resin protrusions are provided in at least one side of the chip substrate to form the clearances in the intermediate portions of the side, the resin is discharge from the clearances between the resin protrusions. Accordingly, the discharge ability of resin from the intermediate portions of the electronic component can be improved, thereby discharging the resin uniformly from the intermediate portions and the end portions of the chip substrate. Therefore, the resin protrusions are uniformly crushed and the adhesion of the conductive portions to the connection terminals is enhanced, thereby obtaining an electronic component with high reliability.

For example, by forming the resin protrusions by the use of a patterning process such as a photolithography process, the plasma process is not required. As a result, since the variation in characteristics of transistors of the electronic component due to the plasma process can be prevented, it is possible to obtain an electronic component with high reliability.

In the electronic component, the plurality of resin protrusions may be provided along the respective sides of the chip substrate to form clearances in the intermediate portions of the respective sides.

As a result, when the electronic component is mounted as described above, the resin can be satisfactorily discharged from the sides of the chip substrate, thereby mounting the electronic component on a counter substrate with enhanced discharge ability of resin. Therefore, the reliability of the electronic component can be further enhanced.

In the electronic component, the resin protrusions may be disposed in plural lines in directions perpendicular to the sides of the chip substrate.

As a result, the number of conductive portions connected to the pad can be increased. Even when one conductive portion is not electrically connected to the corresponding connection terminal at the time of mounting the electronic component, the electronic component can be electrically connected to the terminals of the counter substrate through another conductive portion. Therefore, the reliability at the time of mounting the electronic component can be further enhanced.

In the electronic component, the resin protrusions may be disposed in a zigzag shape along the sides of the chip substrate.

As a result, since the clearances between the end portions of the resin protrusions can be enlarged without changing the number of conductive portions formed on the surfaces of the resin protrusions, it is possible to enhance the discharge ability of resin at the time of mounting the electronic component.

In the electronic component, the resin protrusions may be disposed such that a part of end portions of the resin protrusions overlap with each other in directions perpendicular to the sides of the chip substrate.

When the resin protrusions are disposed on the chip substrate without allowing the end portions of the resin protrusions not to overlap with each other, the conductive portions cannot be formed in the clearances between the resin protrusions. However, in the present invention, since the end portions of the resin protrusions can overlap with each other in the directions perpendicular to the sides of the chip substrate, the conductive portions can be formed on the overlapping portions. Therefore, it is possible to maintain the discharge ability of resin at the time of mounting the electronic component, while effectively utilizing the resin protrusions without reducing the number of clearances between the resin protrusions.

According to another aspect of the present invention, there is provided an electro-optical device in which the electronic component is mounted on at least one of a panel constituting an electro-optical panel and a circuit board.

As described above, since the electro-optical device comprises the electronic component having an excellent electrical connection and an enhanced reliability without requiring a plasma process, the electro-optical device can also have high reliability.

According to another aspect of the present invention, there is provided an electronic apparatus comprising the electro-optical device.

Since the electronic apparatus comprises the electro-optical device having high reliability, the electronic apparatus can also have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic component, an electro-optical device, and an electronic apparatus according to the present invention will be described.

Figure 1:
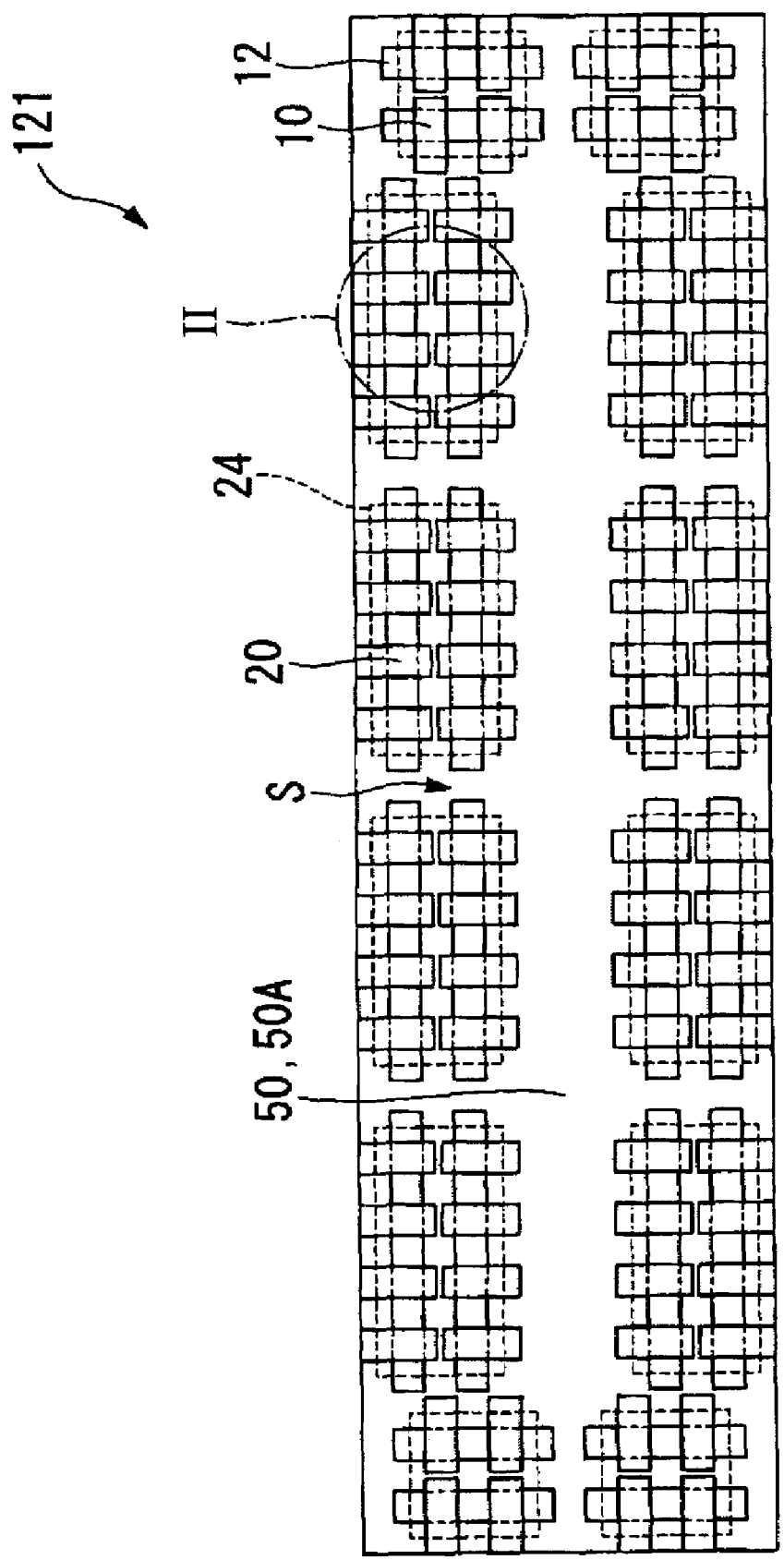
FIG. 1 is a plan view illustrating an electronic component 121 according to the present embodiment.

First, the electronic component according to a first embodiment of the present invention will be described. FIG. 1 is a plan view illustrating an electronic component 121 according to the present embodiment.

As shown in FIG. 1, the electronic component 121 includes, for example, a rectangular chip substrate 50 made of silicon and a rectangular pad 24 which is made of aluminum or the like and which is disposed on an active surface 50A of the chip substrate 50 on which integrated circuits are formed. A plurality of pads 24 are disposed along the outer circumferential edges of the electronic component 121, as indicated by a chained line in FIG. 1. On the chip substrate 50, resin protrusions 12 formed out of a protruded body extending linearly are formed along four sides (circumferential edges) of the active surface 50A of the chip substrate 50. A conductive film 20 electrically connected to the pads 24 is formed on the surfaces of the resin protrusions 12. The conductive film 20 and the resin protrusions 12 constitute bump electrodes (conductive portions) 10 to be described later.

The resin protrusions 12 are disposed to form clearances in intermediate portions of the respective sides of the chip substrate 50. Since the resin protrusions 12 are formed along the sides of the chip substrate 50, the clearances are necessarily formed in end portions of the respective sides of the chip substrate 50.

Specifically, in the present embodiment, the resin protrusions 12 are formed on the pads 24 and are disposed in a direction in which the pads 24 are arranged. Therefore, a clearances S is formed between the resin protrusions 12 formed on the neighboring pads 24 in the direction perpendicular to the corresponding side of the chip substrate 50. That is, as shown in FIG. 1, the resin protrusions 12 are arranged to form the clearances S in the intermediate portions of the four sides of the chip substrate 50.

In the present embodiment, the resin protrusions 12 are formed in two lines in the directions perpendicular to the sides of the chip substrate 50.

The resin protrusions 12 may not be formed necessarily on the pads 24, but may be formed on the neighboring pads 24 along the respective sides, only if the resin protrusions 12 are disposed to form the clearance S in the intermediate portions of the sides of the chip substrate 50. Although the resin protrusions 12 are formed along the four sides of the chip substrate 50 to form the clearances in the intermediate portions of the respective sides, the discharge ability of resin to be described later is sufficient only by forming the resin protrusions 12 in at least one side.

Figure 2:
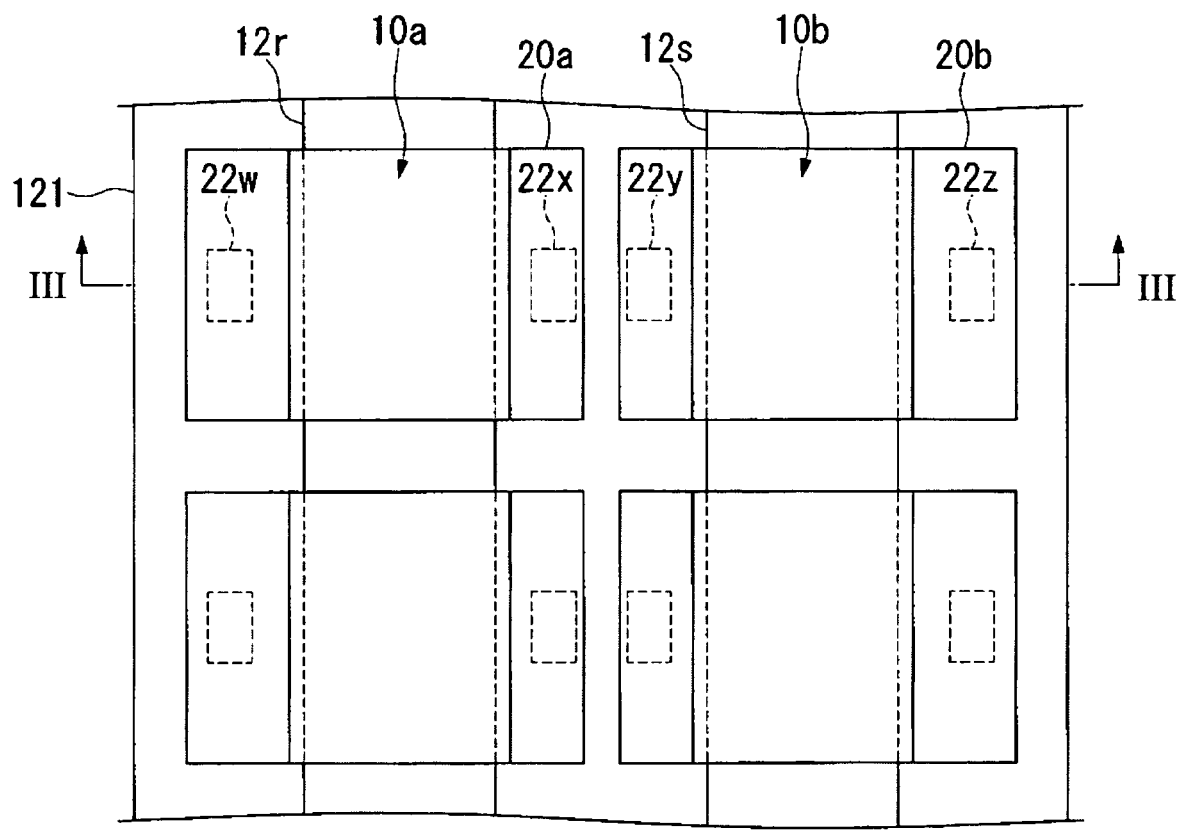
FIG. 2 is an enlarged view of Part II of FIG. 1.
Figure 3:
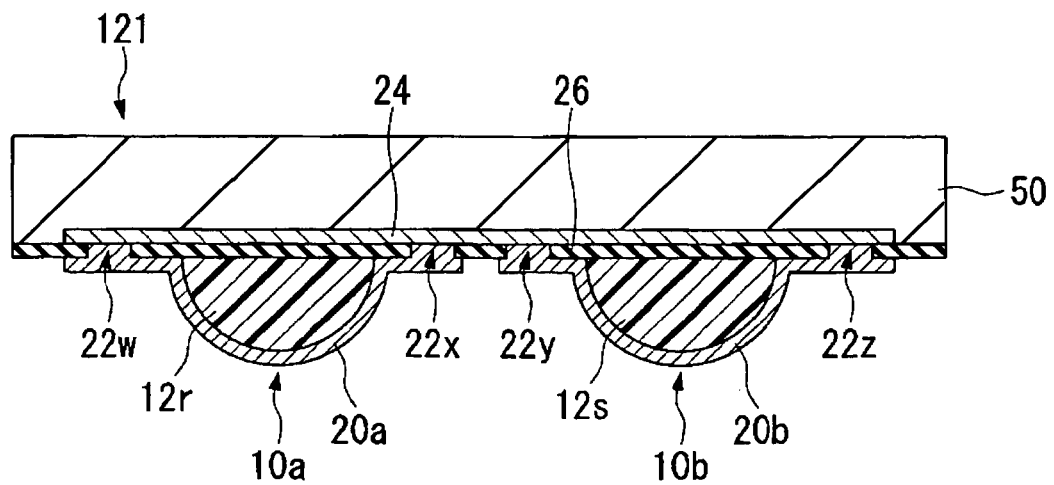
FIG. 3 is a side cross-sectional view taken along Line III-III of FIG. 2.

FIG. 2 is an enlarged view of an important part of the electronic component 121 at a part indicated by a dot-chained line II of FIG. 1 and FIG. 3 is a side cross-sectional view taken along Line III-III of the electronic component 121 shown in FIG. 2.

As shown in FIG. 3, a protective layer 26 such as a passivation layer made of an insulating material such as SiN is formed on the surfaces of the pads 24. Connection portions 22w, 22x, 22y, and 22z allowing the electrical connection to the pads 24 are formed out of openings formed in the protective layer 26.

The resin protrusions 12 are formed on the surface of the protective layer 26. In the present embodiment, as described above, two lines of resin protrusions 12r and 12s are formed on the pads 24. The resin protrusions 12r and 12s are formed by coating the surface of the protective layer 26 with an elastic resin material such as polyimide and performing a patterning process such as a photolithography process. In the present embodiment, by performing the photolithography process using a gray mask, the resin protrusions 12r and 12s have a semi-sphere shape. In this way, by forming the resin protrusions by the use of the patterning process such as the photolithography process, it is possible to prevent variation in characteristic of transistors of the electronic component due to a plasma process.

As shown in FIG. 2, the section of the resin protrusions 12r and 12s in the direction perpendicular to the longitudinal direction of the resin protrusions has a semi-circle shape. Such resin protrusions can be formed with a highly accurate height.

The conductive layer 20 is formed on the surfaces of the resin protrusions 12r and 12s, as shown in FIGS. 2 and 3. The conductive layer 20 can be formed by forming a conductive layer made of conductive metal such as Au, Cu, and Ni by the use of a deposition method or a sputtering method and performing a proper patterning process. The surface of the conductive layer made of Cu, Ni, and Al may be coated with Au plating, thereby enhancing the conductive contact ability.

As shown in FIG. 3, semi-circular bump electrodes (conductive portions) 10a and 10b are formed on the chip substrate 50 by the resin protrusions 12r and 12s and the conductive layer 20.

In the present embodiment, the conductive layer 20 is divided between every bump electrode 10a and 10b. The respective conductive layers 20a and 20b constituting the bump electrode 10a and 10b are disposed to extend to the connection portions 22w, 22x, 22y, and 22z disposed on both sides of the corresponding resin protrusion 12 from the surfaces of the resin protrusions 12r and 12s. Accordingly, one bump electrode 10a is electrically connected to the pad 24 through plural connection portions 22w and 22x. Another bump electrode 10b is electrically connected to the pad 24 through plural connection portions 22y and 22z.

By electrically connecting the plural bump electrodes 10a and 10b formed on the electronic component 121 to the terminals of a counter substrate to be described later, the electronic component can be mounted on the counter substrate.

When the conductive layer 20 is formed on the surfaces of the resin protrusions 12, the connection strength is smaller than that of alloy connection between metal which is a general connection type. If the conductive layer 20 is peeled off from the surface of the resin protrusion 12, the electrical connection of the bump electrode to the terminals of the mounting substrate to be described later may be defective.

Therefore, in the present embodiment, the electronic component 121 has a structure that a plurality of conductive layers 20a and 20b separated from each other are formed on the surfaces of the resin protrusions 12r and 12s. Accordingly, in the electronic component, a plurality of bump electrodes 10a and 10b are electrically connected to the terminals of the mounting substrate. Therefore, even when one conductive layer (for example, conductive layer 20a) is peeled off from the resin protrusion 12, the electrical connection to the terminals of the counter substrate can be secured through another conductive layer (for example, conductive layer 20b) electrically connected to the same pad 24.

The shape of the bump electrodes 10a and 10b is not limited to the semi-circle, but may be a trapezoid, a cone, or the like. In this case, the resin protrusions may be formed in the corresponding shape described above and then the conductive layer 20 may be formed on the surfaces thereof.

The conductive layer 20 extends to the connection portions 22 from the surfaces of the resin protrusions 12a and 12b. Accordingly, the plurality of bump electrodes 10a and 10b are electrically connected to one pad 24.

Mounting Structure

Next, a mounting structure that the electronic component 121 according to the present embodiment is mounted on a substrate 111 constituting an electro-optical device to be described later will be described.

Figure 4:
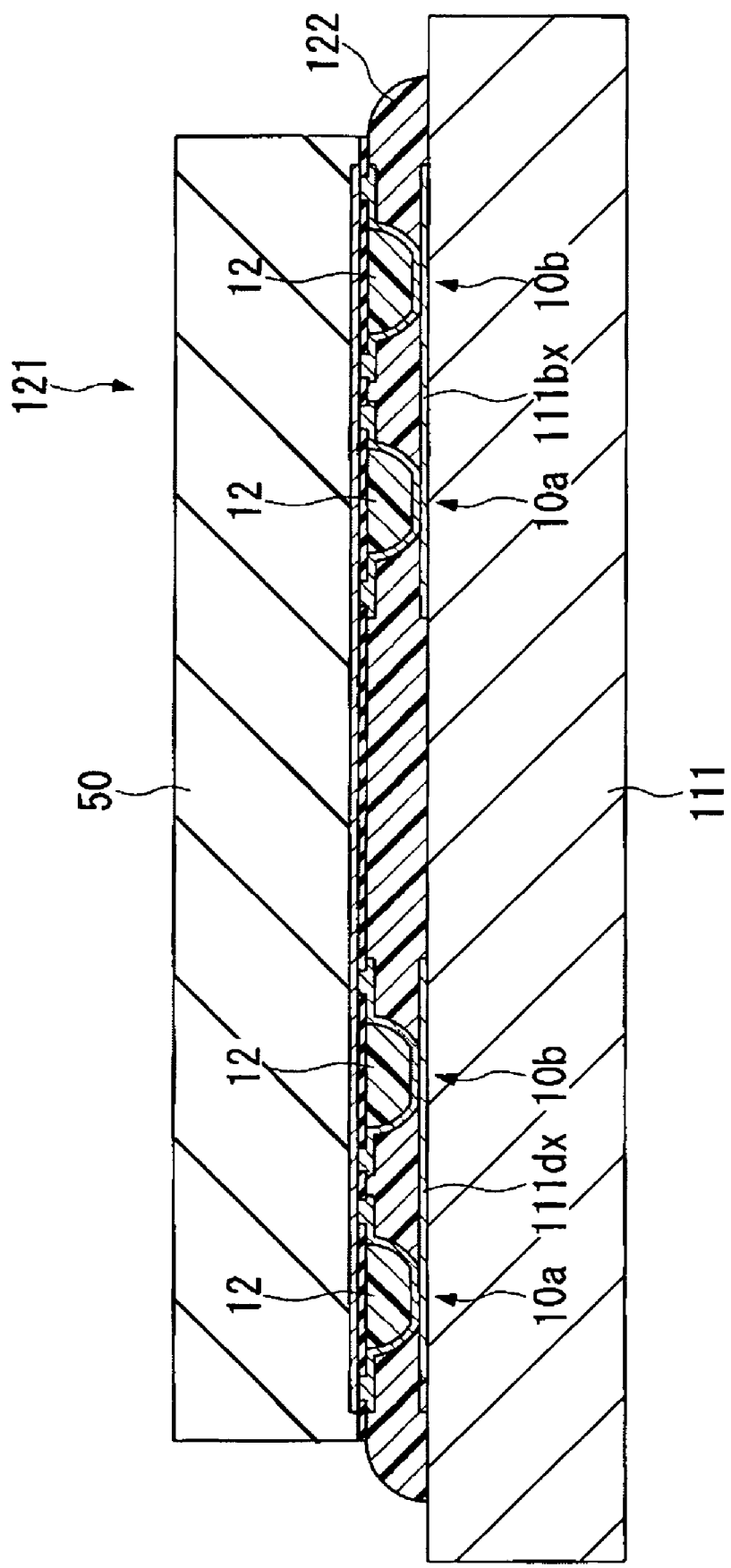
FIG. 4 is an explanatory diagram illustrating a mounting structure of the electronic component according to the first embodiment.

FIG. 4 is an explanatory diagram illustrating the mounting structure that the electronic component 121 is mounted on the substrate 111.

For the purpose of explaining the mounting structure, a method of mounting the electronic component 121 on the substrate 111 will be first described.

In order to form the mounting structure, in the present embodiment, the electronic component 121 is mounted on the substrate 111 by using, for example, NCF (Non Conductive Film) 122 as the resin for retaining the mounting state of the electronic component. In addition, the resin used for mounting the electronic component 121 on the substrate is not limited to the NCF 122, but a resin layer having the same effect may be properly used.

At this time, the NCF 122 is disposed in advance on the substrate 111 to be mounted with the electronic component 121. The NCF 122 has a thickness greater than the thickness of the bump electrodes (resin protrusions 12) formed in the electronic component 121. The NCF 122 is disposed in an area greater than that of the active surface 50A of the electronic component 121, thereby surely mounting the electronic component 121 on the substrate 111 through the use of the NCF 122 therebetween. The NCF 122 may be attached to the active surface 50A of the electronic component 121, instead of the substrate 111, and then the electronic component 121 may be mounted on the substrate 111.

Thereafter, by heating and pressing the electronic component 121, the electronic component is mounted on the substrate 111. At this time, the bump electrodes 10 of the electronic component 121 push out the NCF 122. Then, the gap between the substrate 111 and the electronic component 121 is filled with the NCF 122 and the excessive NCF 122 in the gap is discharged through the clearances S between the resin protrusions 12 constituting the bump electrodes 10.

Here, since the clearances S between the resin protrusions 12 have an influence on the discharge ability of the NCF 122, the arrangement or number of the clearances S affects the reliability of mounting the electronic component 121. Specifically, the amount of the NCF 122 interposed between the electronic component 121 and the substrate 111 becomes greater in the area having a bad discharge ability of the NCF 122 and thus the resin protrusions 12 of the electronic component 121 are in a floating status with respect to the substrate 111. Then, the amount of the resin protrusions 12 crushed decreases as described later, thereby deteriorating the adhesion between the bump electrodes 12 and the terminals 111bx on the substrate 111. In this way, when the discharge ability of the NCF 122 is not uniform on the active surface 50A of the electronic component 121, the reliability in mounting the electronic component 121 on the substrate 111 is deteriorated.

In the present embodiment, the electronic component 121 includes a plurality of resin protrusions 12 disposed along the four sides of the chip substrate 50 as described above. The clearances 12 opened in the directions perpendicular to the respective sides of the chip substrate 50 are formed between the resin protrusions 12 arranged along the sides of the chip substrate 50. As shown in FIG. 3, since the clearances S are formed in the intermediate portions and the end portions of the respective sides, the electronic component 121 discharges the excessive NCF 122 unnecessary for the gap between the electronic component 121 and the substrate 111 from the clearances S onto the substrate 111. Accordingly, the NCF 122 can be satisfactorily discharged from the intermediate portions of the electronic component 12. Furthermore, in the present embodiment, as shown in FIG. 1, since the clearances between the resin protrusions 10 are disposed approximately uniform on the chip substrate 50, the NCF 122 can be discharged more uniformly from the intermediate portions and the end portions of the chip substrate 50.

In this way, when the electronic component 121 is heated and pressed onto the substrate 111, the bump electrodes 10 including the resin protrusions 12 of the electronic component 121 come in contact with the terminals 111bx of the substrate 111. By heating and pressing the electronic component, the bump electrodes 10 are crushed and elastically deformed. In this state, the heating and pressing of the electronic component 121 are stopped. Then, the relative position between the electronic component 121 and the substrate 111 is fixed and the resin protrusions 12 maintain the elastically deformed state. Accordingly, even when the NCF 122 is thermally expanded with variation in temperature, the conductive connection between the bump electrodes 10 and the terminals 111bx is retained. As a result, it is possible to satisfactorily electrically connect the electronic component 121 to the substrate 111.

That is, the electronic component 121 is mounted on the substrate 111 with the NCF 122 interposed therebetween.

At this time, as shown in FIG. 4, since the resin protrusions 12 are uniformly crushed and thus the bump electrodes 10 including the resin protrusions 12 and the terminals 111bx formed on the substrate 111 are electrically connected to each other, it is possible to obtain a mounting structure with high reliability.

At this time, as described above, the electronic component 121 according to the present embodiment has a structure that a plurality of bump electrodes 10a and 10b are electrically connected to one pad 24. In the mounting structure shown in FIG. 4, a plurality of bump electrodes 10a and 10b provided on one pad 24 are electrically connected to one terminal 111bx of the counter substrate 111. Accordingly, even when the conductive layer 20 of one bump electrode (for example, 10a) of the plurality of bump electrodes 10a and 10b is peeled off, the electrical connection between the pad 24 and the terminal 111bx of the substrate 111 can be secured by the use of the other bump electrodes (for example, 10b) electrically connected to the same pad 24.

Since a plurality of bump electrodes 10a and 10b are electrically connected to one terminal 111bx of the counter substrate, the electrical resistance of the conductive connection portions can be reduced.

As described above, the electronic component 121 is mounted on the substrate 111 with the NCF 122 interposed therebetween. At this time, as shown in FIG. 2, by removing a part of the surfaces of the resin protrusions 12 on which the conductive layer 20 is not formed and thus reducing the thickness of the resin protrusions 12, a gap may be formed between the substrate 111 and the resin protrusions 12, thereby enhancing the discharge ability of the NCF 122 through the gap.

In a specific method of forming the gap, as shown in FIG. 2, a part of the resin protrusions 12r and 12s on which the conductive layers 20a and 20b are not formed is removed by the use of a plasma etching process with strength not varying the characteristics formed on the electronic component 121 using $O_2$ as a process gas. In the present invention, the plasma process is not required, but only if a plasma process has strength not varying the characteristics of transistors of the electronic component 121, the plasma process can be used properly.

At this time, since the conductive layers 20a and 20b made of a metal material are dry-etched less than the resin material, only the resin protrusions 12r and 12s can be selectively etched in the area on which the conductive layers 20a and 20b are not formed.

Accordingly, it is possible to obtain the electronic component 121 having enhanced reliability and discharge ability of the NCF 122.

In the present invention, when the electronic component 121 is mounted on the substrate 111 with the NCF 122 thicker than the resin protrusions 12 interposed therebetween, the resin protrusions 12 are crushed while pushing out the NCF 122 and thus the bump electrodes including the resin protrusions 12 are electrically connected to the terminals 111bx of the substrate 111. At this time, since a plurality of resin protrusions 12 are formed in at least one side of the chip substrate 50 to form the clearances in the intermediate portion of the side, the NCF 122 is discharged through the clearances S between the resin protrusions 12. Accordingly, the discharge ability of the NCF 122 from the intermediate portion 121 of the electronic component 121 can be enhanced, thereby discharging the NCF 122 from the intermediate portions and the end portions of the chip substrate 50. Therefore, the resin protrusions 12 are uniformly crushed to enhance the adhesion between the bump electrodes 12 and the terminals 111bx, thereby obtaining the electronic component 121 with high reliability.

Since the resin protrusions 12 are formed by the use of a patterning process such as a photolithography method, it is possible to prevent the variation in characteristics of transistors of the electronic component 121 due to the plasma process and thus to obtain the electronic component 121 with high reliability.

Second Embodiment

Next, a second embodiment of the present invention will be described with reference to FIG. 5.

Figure 5:
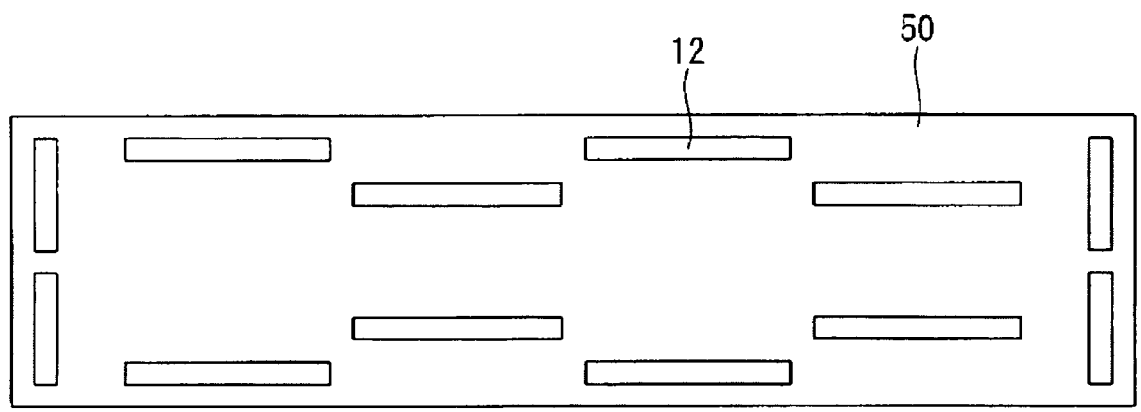
FIG. 5 is a plan view illustrating an electronic component according to a second embodiment of the present invention.

FIG. 5 is a plan view illustrating an electronic component according to the second embodiment of the present invention. The electronic component according to the second embodiment has the same structure as the first embodiment, except that the arrangement of the resin protrusions 12 formed on the chip substrate 50 is different. Elements similar to those of the first embodiment are denoted by the same reference numerals and detailed description thereof will be omitted. In FIG. 5, the pads 24 provided on the electronic component, the conductive layer 20 connected to the pads, and the bump electrodes 10 are omitted for the purpose of convenient explanation.

As shown in FIG. 5, in the electronic component according to the second embodiment, the resin protrusions 12 are arranged in a zigzag shape along the longitudinal side of the rectangular chip substrate 50. Here, the resin protrusions 12 are arranged to form the clearances S in the intermediate portions of the longitudinal sides of the chip substrate 50. In the present embodiment, the clearances S formed in the intermediate portions serves to discharge the resin (NCF 122) from the central portion of the chip substrate 50.

The conductive layer 20 not shown is formed on the surfaces of the resin protrusions 12 similarly to the first embodiment, thereby constituting bump electrodes 10.

When the resin protrusions 12 are formed in a zigzag shape on the chip substrate 50 as described in the present embodiment, the minimum distance between the neighboring resin protrusions 12 is increased to secure the greater clearances, compared with the case that a plurality of resin protrusions 12 are arranged in a line shape along the longitudinal side of the chip substrate 50. Accordingly, similarly to the first embodiment, it is possible to further enhance the discharge ability of the NCF 122 in mounting the electronic component 121 on the substrate 111 with the NCF 122 interposed therebetween. Accordingly, the electronic component according to the present embodiment can have high reliability.

In the present embodiment, the resin protrusions 12 formed along the longitudinal sides of the chip substrate 50 are arranged in a zigzag shape, but the resin protrusions 12 formed along the transverse sides may be arranged in a zigzag, thereby further enhancing the discharge ability of the NCF 122. As described above, the resin protrusions 12 formed on the electronic component 121 may be arranged in a zigzag shape along one side of the four sides of the chip substrate 50. In addition, by increasing the number of resin protrusions 12 arranged in a zigzag shape to increase the number of bump electrodes 10, the connection reliability of the electronic component can be further enhanced without damaging the discharge ability of the NCF 122.

Third Embodiment

Next, a third embodiment of the present invention will be described with reference to FIG. 6.

Figure 6:
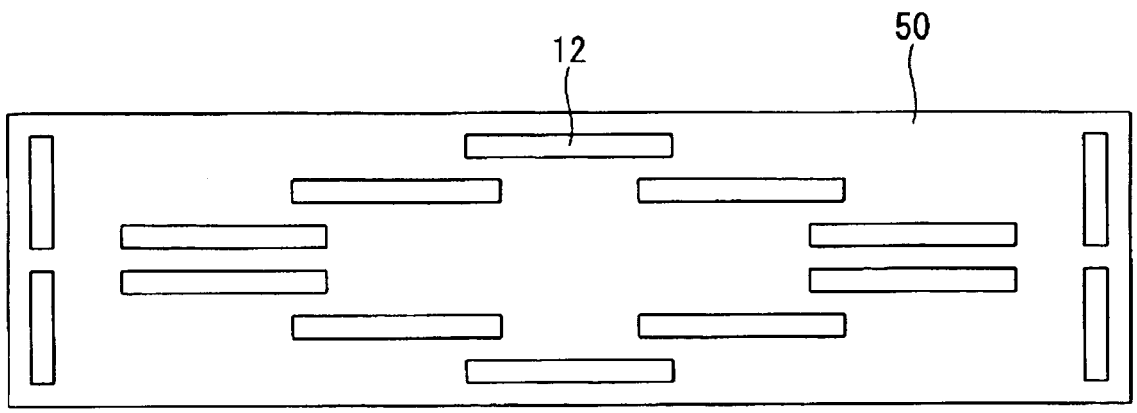
FIG. 6 is a plan view illustrating an electronic component according to a third embodiment of the present invention.

FIG. 6 is a plan view illustrating an electronic component according to a third embodiment of the present invention. The electronic component according to the third embodiment has the same structure as those of the first and second embodiments, except that the arrangement of the resin protrusions 12 formed on the chip substrate 50 is different. Elements similar to those of the first embodiment are denoted by the same reference numerals and detailed description thereof will be omitted. In FIG. 6, the pads 24 provided on the electronic component and the bump electrodes 10 including the conductive layer 20 connected to the pads are omitted for the purpose of convenient explanation.

As shown in FIG. 6, the resin protrusions 12 are formed along the sides of the chip substrate 50 and a part of the end portions of the resin protrusions 12 overlap with each other in a direction perpendicular to the longitudinal side of the chip substrate 50 along the longitudinal side of the chip substrate 50. The conductive layer 20 not shown is formed on the surfaces of the resin protrusions 12 similarly to the first embodiment, thereby constituting the bump electrodes 10. In the present embodiment, the clearances formed in the intermediate portions of the sides of the chip substrate 50 means the clearances S for discharging the resin (NCF 122) from the central portion of the chip substrate 50.

In this way, a part of the end portions of the resin protrusions 12 overlap with each other. However, for example, when the resin protrusions 12 are arranged in a line shape on the chip substrate 50 and the end portions of the resin protrusions 12 do not overlap with each other, the bump electrode 10 cannot be formed at the position corresponding to the clearance S between the neighboring resin protrusions 12. Accordingly, in the present embodiment, a part of the end portions of the resin protrusions 12 overlap with each other in the direction perpendicular to the longitudinal side of the chip substrate 50. At this time, at the positions where the end portions of the resin protrusions 12 overlap with each other, the clearances along the longitudinal sides of the chip substrate 50 are formed between the neighboring resin protrusions 12.

The conductive layer 20 is formed at the positions corresponding to the clearances. However, since the thickness of the conductive layer 20 is much less than those of the resin protrusions 12, the NCF 122 can be smoothly discharged out of the substrate 111 through the clearances and over the conductive layer 20. The clearances are formed in the longitudinal direction of the chip substrate 50 as described above, but since the resin such as the NCF 122 is isotropically spread, the NCF 122 at the intermediate portion of the chip substrate 50 can be smoothly pushed out.

Therefore, it is possible to maintain the discharge ability of resin in mounting the electronic component by the effective use of the resin protrusions 12.

That is, since the resin protrusions 12 arranged along the longitudinal sides of the chip substrate 50 do not form the clearances in the direction perpendicular to the longitudinal side, the degree of freedom in positioning the bump electrodes 10 along the longitudinal sides of the chip substrate 50 can be improved.

In the electronic component according to the present invention, since the bump electrodes 10 can be formed in the overlapping portions between the end portions of the resin protrusions 12, the clearances between the resin protrusions 12 are not reduced, thereby not varying the discharge ability of the NCF 122. In addition, when the end portions of the resin protrusions 12 do not overlap with each other as described above, the bump electrodes 10 can be formed in the portions corresponding to the clearances, thereby efficiently utilizing the resin protrusions 12.

The electronic component according to the present invention is not limited to the embodiments described above, but may be modified in various forms. For example, in the above-mentioned embodiments, a plurality of bump electrodes 10 are formed on the resin protrusion 12 formed for each pad 24, but the decrease in pitch of the electronic component 121 may be obtained by forming one bump electrode 10 every pad 24.

Next, an electro-optical device comprising the electronic component according to the present invention will be described.

Figure 7:
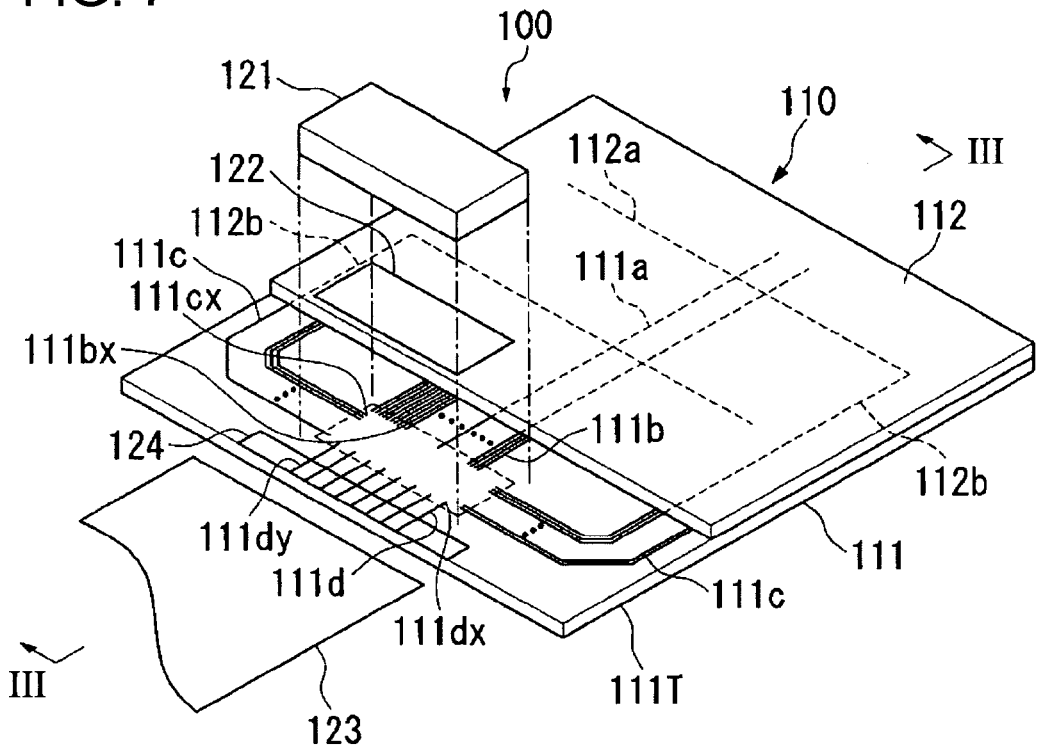
FIG. 7 is a perspective view schematically illustrating a liquid crystal display device.

FIG. 7 is a schematic diagram illustrating a liquid crystal display device which is an example of the electro-optical device. In FIG. 7, reference numeral 100 denotes a liquid crystal display device. The liquid crystal display device 100 includes a liquid crystal panel 110 and the electronic component 121 according to the first embodiment of the present invention as a liquid crystal driving IC chip. Accessory members such as a polarizing film, a reflecting sheet, a backlight not shown can be properly provided as needed.

Electro-optical Device

The liquid crystal panel 110 includes the above-mentioned substrates 111 and 112 made of glass or plastic. The substrate 111 and the counter substrate 112 are opposed to each other and are bonded to each other with a sealing material not shown. A liquid crystal as an electro-optical material not shown is enclosed between the substrate 111 and the counter substrate 112. Electrodes 111a made of a transparent conductive material such as ITO (Indium Tin Oxide) on the inner surface of the substrate 111 and electrodes 112a opposed to the electrodes 111a are formed on the inner surface of the counter substrate 112. The electrodes 111a and the electrodes 112a are arranged to intersect each other. The electrodes 111a and the electrodes 112a are drawn out to a substrate extension 111T and electrode terminals 111bx and electrode terminals 111cx are formed at the ends. Input wires 111dx are formed in the vicinity of the edge of the substrate extension 111T and terminals 111dx are formed in the vicinity of the inner end thereof.

The electronic component 121 is mounted on the substrate extension 111T, for example, with the above-mentioned NCF 122 interposed therebetween. The electronic component 121 is, for example, a liquid crystal driving IC chip for driving the liquid crystal panel 110. A plurality of bumps not shown are formed on the bottom surface of the electronic component 121 and the bumps are electrically connected to the terminals 111bx, 111cx, and 111dx on the substrate extension 111T.

The side cross-section taken along Line III-III of FIG. 7 corresponds to FIG. 4 showing the mounting structure where the electronic component 121 is mounted on the substrate 111.

As shown in FIG. 4, the electronic component 121 is mounted on the substrate by bringing the ends of a plurality of bump electrodes 10 connected to the pads 24 formed on the active surface into direct contact with the terminals 111bx and 111dx of the substrate 111. At this time, the NCF 122 is filled around the electrical connection portions between the bump electrodes 10 and the terminals 111bx and 111dx.

Accordingly, as described above, since the electronic component 121 has an excellent discharge ability of the NCF 122, the bump electrodes 10 and the terminals 111bx can be stably electrically connected to each other.

A flexible printed circuit board 123 is fitted to input terminals 111dy formed at an outer end portion of the input wires 111d with an anisotropic conductive film 124 interposed therebetween. The input terminals 111dy are electrically connected to corresponding wires not shown provided on the flexible printed circuit board 123. Control signals, image signals, power source potential, and the like are supplied to the input terminals 111dy through the flexible printed circuit board 123 from the outside, liquid crystal driving signals are generated from the electronic component 121, and then the generated signals are supplied to the liquid crystal panel 110.

In this way, the liquid crystal display device 100 according to the present embodiment can modulate light by re-aligning the liquid crystal molecules in the pixels in which the electrodes 111a and the electrodes 112a are opposed to each other in response to application of a predetermined voltage between both electrodes 111a and 112a through the electronic component 121. Accordingly, a desired image can be formed in a display area in which the pixels are arranged in the liquid crystal panel 110.

Since the liquid crystal display device 100 according to the present invention comprises the electronic component 121 having an excellent electrical connection and an enhanced reliability without requiring a plasma process, the liquid crystal display device 100 can also have high reliability.

Electronic Apparatus

Figure 8:
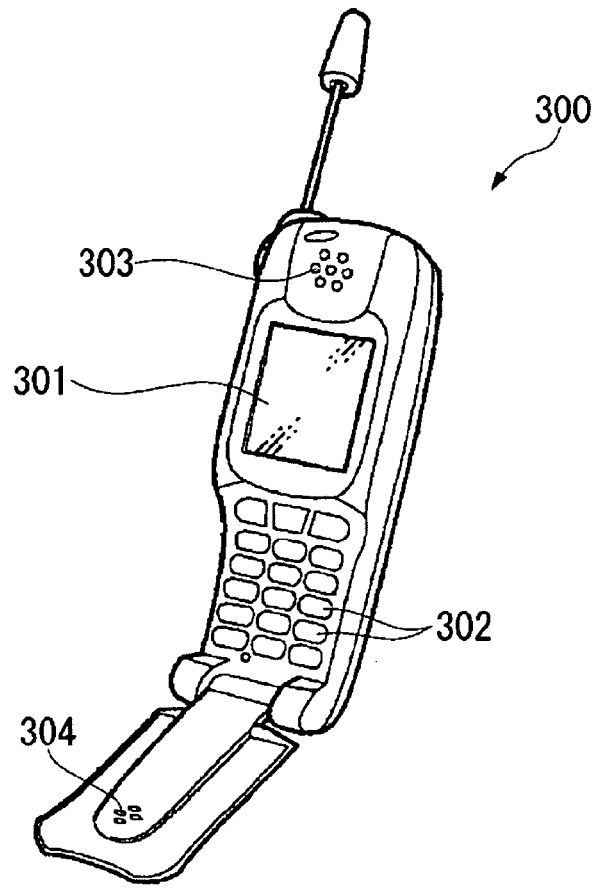
FIG. 8 is a perspective view illustrating a mobile phone.

FIG. 8 is a perspective view illustrating a mobile phone. The mobile phone 300 shown in FIG. 8 includes the above-mentioned electro-optical device as a small-sized display unit 301, a plurality of push buttons 302, a receiver 303, and a transmitter 304.

The above-mentioned electro-optical device is not limited to the mobile phone, but can be suitably used as an image display unit of an electronic book, a personal computer, a digital still camera, a liquid crystal television, a view-finder type or monitor direct-view type video tape recorder, a car navigation apparatus, a phaser, an electronic pocketbook, a calculator, a word processor, a work station, a television phone, a POS terminal, an apparatus having a touch panel, and the like. In any case thereof, it is possible to provide an electronic apparatus having excellent reliability in electrical connection.

Since the mobile phone 300 according to the present invention includes the electro-optical device with high reliability described above, the mobile phone 300 can also have high reliability.

The technical scope of the present invention is not limited to the embodiments described above but includes various modifications of the above-mentioned embodiments. That is, the specific materials and structures exemplified in the above-mentioned embodiments are merely examples and can be properly changed.

What is claimed is:

1. An electronic component comprising:
    a rectangular chip substrate having an active surface;
    a plurality of pads provided on said active surface, said plurality of pads including first and second pads disposed proximate a first side of said rectangular chip substrate;
    a plurality of elongate resin protrusions provided on said pads and each having a protruded body extending away from said active surface, said plurality of elongate resin protrusions including first and second resin protrusions extending linearly along said first side and over said first and second pads, respectively, said first and second resin protrusions being spaced apart along said first side so as to form a clearance between ends thereof, said clearance being in an intermediate portion of said first side;
    a plurality of bump electrodes formed on a surface of said elongate resin protrusions;
    wherein said plurality of bump electrodes are formed by a plurality of conductive layers including first conductive layers extending over said first pad and said first resin protrusion and second conductive layers extending over said second pad and said second resin protrusion, said first and second conductive layers being spaced apart along said first and second resin protrusions, respectively, said first conductive layers each including at least one conductive portion electrically connected to said first pad, said second conductive layers each including at least one conductive portion electrically connected to said second pad;
    said first and second resin protrusions overlap said first and second pads, respectively, in directions perpendicular to a length of said first and second pads; and
    said first and second conductive layers overlap said first and second resin protrusions, respectively, in directions perpendicular to a length of said first and second resin protrusions.

2. The electronic component according to claim 1, wherein said resin protrusions are provided along all sides of said rectangular chip substrate, said resin protrusions being spaced apart along each of said sides so as to form clearances in intermediate portions of said sides.

3. The electronic component according to claim 1, wherein said plurality of elongate resin protrusions includes first and second pairs of resin protrusions, said first pair including said first resin protrusion and a third resin protrusion spaced apart in opposing positions along said first side of said rectangular chip substrate, said second pair including said second resin protrusion and a fourth resin protrusion spaced apart in opposing positions along said first side of said rectangular chip substrate, said first and second pairs being disposed with said first and second resin protrusions aligned and with said third and fourth resin protrusions aligned.

4. The electronic component according to claim 1, wherein said first and second resin protrusions are offset from one another in a zigzag shape along said first side of said rectangular chip substrate.

5. An electro-optical device comprising the electronic component according to claim 1 which is mounted on at least one of a panel constituting an electro-optical panel and a circuit board.

6. An electronic apparatus comprising the electro-optical device according to claim 5.

7. An electronic component comprising:
a rectangular chip substrate having an active surface;
a plurality of pads provided on said active surface;
a plurality of elongate resin protrusions provided on said pads and each having a protruded body extending away from said active surface, said resin protrusions extending along a length of said rectangular chip substrate, said resin protrusions being disposed such that end portions thereof overlap with each other in directions perpendicular to said length of said rectangular chip substrate; and
a plurality of conductive layers extending over said resin protrusions, said conductive layers being spaced apart along said resin protrusions, said conductive layers each including at least one conductive portion electrically connected to one of said pads,
wherein said resin protrusions overlap said pads in directions parallel to a length of pads; and
said conductive layers extend over said resin protrusions in directions perpendicular to a length of said resin protrusions.

* * * * *